(12) United States Patent
Tohyama (10) Patent No.: US 7,786,700 B2
(45) Date of Patent: Aug. 31, 2010

(54) BATTERY-POWERED APPARATUS, METHOD OF CONTROLLING THE APPARATUS, PROGRAM FOR IMPLEMENTING THE METHOD, AND STORAGE MEDIUM STORING THE PROGRAM

(75) Inventor: Kei Tohyama, Kawasaki (JP)

(73) Assignee: Canon Kabushiki Kaisha (JP)

( * ) Notice: Subject to any disclaimer, the term of this patent is extended or adjusted under 35 U.S.C. 154(b) by 158 days.

(21) Appl. No.: 11/465,504

(22) Filed: Aug. 18, 2006

(65) Prior Publication Data
US 2007/0046262 A1  Mar. 1, 2007

(30) Foreign Application Priority Data
Aug. 25, 2005  (JP) .............................. 2005-244912

(51) Int. Cl.
*H02J 7/16* (2006.01)
*H02J 7/00* (2006.01)
*H02J 7/04* (2006.01)

(52) U.S. Cl. .................. 320/134; 320/135; 320/136; 320/165; 320/149

(58) Field of Classification Search ................ 320/128, 320/165, 106, 134, 135, 136, 137, 148, 149, 320/161, 162, 132, 164
See application file for complete search history.

(56) References Cited

U.S. PATENT DOCUMENTS

| | | | | |
|---|---|---|---|---|
| 5,352,968 A | * | 10/1994 | Reni et al. | 320/136 |
| 5,691,620 A | * | 11/1997 | Nagai et al. | 320/106 |
| 5,844,884 A | * | 12/1998 | Szlenski | 320/149 |
| 5,969,508 A | * | 10/1999 | Patino et al. | 320/153 |
| 5,998,972 A | * | 12/1999 | Gong | 320/134 |
| 6,417,648 B2 | * | 7/2002 | Suzuki et al. | 320/136 |
| 6,809,649 B1 | * | 10/2004 | Wendelrup et al. | 340/636.1 |
| 6,823,274 B2 | * | 11/2004 | Zimmerman et al. | 702/63 |
| 7,408,325 B2 | * | 8/2008 | Yamamoto et al. | 320/133 |
| 7,688,033 B2 | * | 3/2010 | Minamiura | 320/134 |

(Continued)

FOREIGN PATENT DOCUMENTS

JP      H07140531      6/1995

(Continued)

OTHER PUBLICATIONS

Office Action issued in corresponding Japanese Patent Application No. 2005-244912 dated Sep. 15, 2009.

*Primary Examiner*—Edward Tso
*Assistant Examiner*—Alexis Boateng
(74) *Attorney, Agent, or Firm*—Rossi, Kimms & McDowell LLP (57) ABSTRACT

A battery-powered apparatus which makes it possible to perform battery check with accuracy irrespective of whether a battery is used as an internal battery or an external battery and make the end voltages of the internal battery and the external battery coincide with each other. It is determined whether the battery or an accessory having the battery incorporated therein has been attached to the apparatus, and a predetermined voltage threshold level is set based on the determination result. The voltage value of the battery or the accessory having the battery incorporated therein is detected, and the detected voltage value and the voltage threshold level are compared with each other to decide whether or not it is possible to drive the apparatus.

6 Claims, 4 Drawing Sheets

U.S. PATENT DOCUMENTS

| | | | |
|---|---|---|---|
| 2001/0052758 A1* | 12/2001 | Odaohhara | 320/103 |
| 2003/0088376 A1* | 5/2003 | Zimmerman et al. | 702/63 |
| 2003/0132732 A1* | 7/2003 | Thomas et al. | 320/134 |
| 2005/0057220 A1* | 3/2005 | Miwa et al. | 320/116 |
| 2005/0657220 * | 3/2005 | Miwa | 320/116 |
| 2005/0099161 A1* | 5/2005 | Sato | 320/134 |
| 2005/0162132 A1* | 7/2005 | Nagasawa | 320/128 |
| 2005/0174094 A1* | 8/2005 | Purdy et al. | 320/134 |
| 2005/0258805 A1* | 11/2005 | Thomas et al. | 320/134 |
| 2007/0018611 A1* | 1/2007 | Anttila et al. | 320/114 |

FOREIGN PATENT DOCUMENTS

| | | |
|---|---|---|
| JP | 11-275768 A | 10/1999 |

\* cited by examiner

BATTERY-POWERED APPARATUS, METHOD OF CONTROLLING THE APPARATUS, PROGRAM FOR IMPLEMENTING THE METHOD, AND STORAGE MEDIUM STORING THE PROGRAM

BACKGROUND OF THE INVENTION

1. Field of the Invention

The present invention relates to a battery-powered apparatus, a method of controlling the apparatus, a program for implementing the method, and a storage medium storing the program. In particular, the present invention relates to a battery-powered apparatus including a remaining battery level detecting circuit, a method of controlling the apparatus, a program for implementing the method, and a storage medium storing the program.

2. Description of the Related Art

Conventionally, there have been known some apparatuses such as cameras of the type which is powered by a battery disposed within the main body of the apparatus (hereinafter referred to as "the internal battery") and a battery externally connected to the main body of the apparatus (hereinafter referred to as "the external battery"). If both the internal battery and the external battery are connected to the apparatus, using the external battery takes priority over using the internal battery.

In the apparatus of this type, one detecting circuit detects the remaining battery level of the internal battery and the remaining battery level of the external battery, and the guaranteed minimum voltage level for the main body of the apparatus is used as a criterion by which the detecting circuit determines whether to prohibit the use of each battery (see Japanese Laid-Open Patent Publication (Kokai) No. H07-140531, for example).

According to the above conventional art, however, since one detecting circuit detects the remaining battery level of the internal battery and the remaining battery level of the external battery, a difference between the impedance from the internal battery to the detecting circuit and the impedance from the external battery to the detecting circuit cannot be taken into consideration, resulting in a difference in end voltage between the internal voltage and the external voltage. For this reason, if the unusable voltage level is determined with reference to the internal battery, the capacity of the external battery cannot be effectively used.

SUMMARY OF THE INVENTION

It is an object of the present invention to provide a battery-powered apparatus and a method of controlling the same which make it possible to perform battery check with accuracy irrespective of whether a battery is used as an internal battery or an external battery and make the end voltages of the internal battery and the external battery coincide with each other, as well as a program for implementing the method and a storage medium storing the program.

To attain the above object, in a first aspect of the present invention, there is provided a battery-powered apparatus configured in such a manner that a battery is directly attached to the apparatus and an accessory having the battery incorporated therein is attached to the apparatus, comprising: a determining unit that determines whether the battery or the accessory having the battery incorporated therein has been attached to the apparatus; a setting unit that sets a predetermined voltage threshold level based on a result of the determination by the determining unit; a detecting unit that detects a voltage value of the battery or the accessory having the battery incorporated therein; and a deciding unit that compares the voltage value detected by the detecting unit and the voltage threshold level set by the setting unit with each other to decide whether it is possible to drive the apparatus.

Preferably, the setting unit sets the voltage threshold level in such a manner that a voltage threshold level for use in a case where the battery is directly attached to the apparatus is higher than a voltage threshold level for use in a case where the accessory having the battery incorporated therein has been attached to the apparatus.

Preferably, the setting unit sets the voltage threshold level based on a difference between a power supply impedance exhibited in a case where the battery is directly attached to the apparatus and a power supply impedance exhibited in a case where the accessory having the battery incorporated therein has been attached to the apparatus.

Preferably, the voltage threshold level is set based on a minimum voltage with which it is possible to drive the apparatus.

Preferably, the voltage threshold level is set based on a discharge stop voltage of the battery.

Preferably, the battery-powered apparatus comprises a camera.

To attain the above object, in a second aspect of the present invention, there is provided a method of controlling a battery-powered apparatus configured in such a manner that a battery is directly attached to the apparatus and an accessory having the battery incorporated therein is attached to the apparatus, comprising: a determining step of determining whether the battery or the accessory having the battery incorporated therein has been attached to the apparatus; a setting step of setting a predetermined voltage threshold level based on a result of the determination in the determining step; a detecting step of detecting a voltage value of the battery or the accessory having the battery incorporated therein; and a deciding step of comparing the voltage value detected in the detecting step and the voltage threshold level set in the setting step with each other to decide whether it is possible to drive the apparatus.

Preferably, in the setting step, the voltage threshold level is set in such a manner that a voltage threshold level for use in a case where the battery is directly attached to the apparatus is higher than a voltage threshold level for use in a case where the accessory having the battery incorporated therein has been attached to the apparatus.

Preferably, wherein in the setting step, the voltage threshold level is set based on a difference between a power supply impedance exhibited in a case where the battery is directly attached to the apparatus and a power supply impedance exhibited in a case where the accessory having the battery incorporated therein has been attached to the apparatus.

Preferably, the voltage threshold level is set based on a minimum voltage with which it is possible to drive the apparatus.

Preferably, the voltage threshold level is set based on a discharge stop voltage of the battery.

Preferably, the battery-powered apparatus comprises a camera.

To attain the above object, in a third aspect of the present invention, there is provided a program for causing a computer to execute a method of controlling a battery-powered apparatus configured in such a manner that a battery is directly attached to the apparatus and an accessory having the battery incorporated therein is attached to the apparatus, comprising: a determining module for determining whether the battery or the accessory having the battery incorporated therein has been attached to the apparatus; a setting module for setting a predetermined voltage threshold level based on a result of the determination by the determining module; a detecting module for detecting a voltage value of the battery or the accessory having the battery incorporated therein; and a deciding module for comparing the voltage value detected by the detecting module and the voltage threshold level set by the setting module with each other to decide whether it is possible to drive the apparatus.

To attain the above object, in a fourth aspect of the present invention, there is provided a computer-readable storage medium storing a program according to claim 13.

According to the present invention, in the battery-powered apparatus configured in such a manner that the battery is directly attached to the apparatus and the accessory having the battery incorporated therein is attached to the apparatus, the voltage threshold level is set based on whether the battery or the accessory having the battery incorporated therein has been attached to the apparatus in deciding whether or not the apparatus can be driven by comparing the detected voltage value of the battery or the accessory having the battery incorporated therein with the voltage threshold level. For this reason, battery check can be performed with accuracy irrespective of whether the battery is used as the internal battery or the external battery. Additionally, it is possible to eliminate the conventional inconveniences that the capacity of the battery cannot be effectively used and the battery voltage becomes lower than the unusable voltage.

The other features and advantages of the present invention will be apparent from the following description taken in conjunction with the accompanying drawings, in which like reference characters designate the same or similar parts through the figures thereof.

BRIEF DESCRIPTION OF THE DRAWINGS

The accompanying drawings, which are incorporated in and constitute a part of the specification, illustrate an embodiment of the present invention and, together with the description, serve to explain the principles of the present invention.

DETAILED DESCRIPTION OF THE PREFERRED EMBODIMENTS

Preferred embodiments of the present invention will be described in detail below with reference to the drawings.

Figure 1:
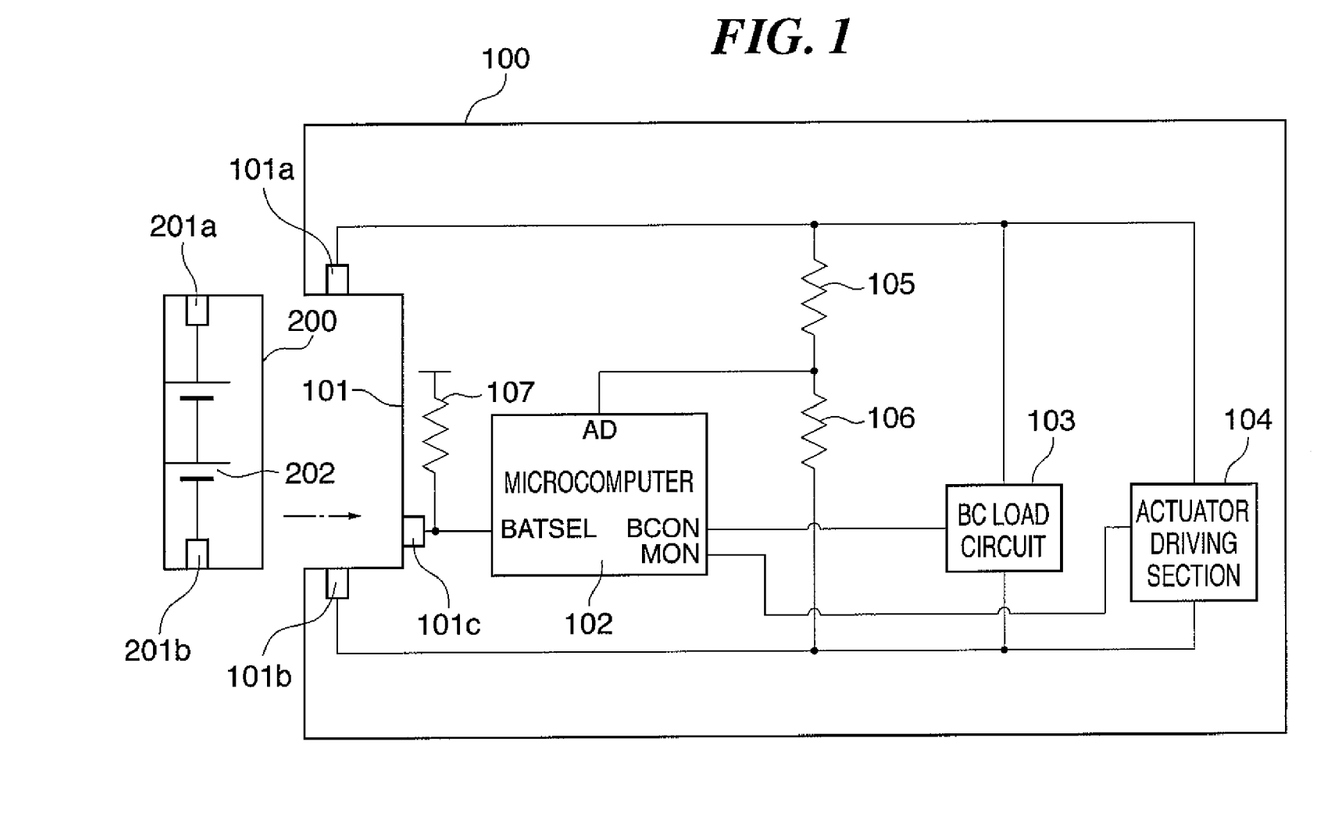
FIG. 1 is a block diagram schematically showing the construction of a battery-powered apparatus according to an embodiment of the present invention.

FIG. 1 is a block diagram schematically showing the construction of a battery-powered apparatus according to an embodiment of the present invention.

As shown in FIG. 1, a camera 100 as a battery-powered apparatus according to an embodiment of the present invention has a connection section 101 which is recessed so as to fit therein a battery pack 200 or a connection section 301 of an accessory 300 in FIG. 2 as will be described later.

The battery pack 200 is directly attached to the connection section 101 of the camera 100.

Also, the accessory 300 having the battery pack 200 incorporated therein is attached to the connection section 101 of the camera 100.

The camera 100 is comprised of a positive contact 101a disposed on one side of the connection section 101, a negative contact 101b disposed on the other side of the connection section 101, and a determination contact 101c disposed on the bottom of the connection section 101.

The camera 100 is further comprised of a resistor 105 and a resistor 106, a BC load circuit 103, and an actuator driving section 104, which are connected in parallel between the positive contact 101a and the negative contact 101b. The camera 100 is further comprised of a microcomputer 102 which has an AD terminal connected between the resistors 105 and 106, a BCON terminal connected to the BC load circuit 103, a MON terminal connected to the actuator driving section 104, and a BATSEL terminal connected to the determination contact 101c. A resistor 107 is connected to the determination contact 101c.

The battery pack 200 is adapted to be fitted into the connection section 101 of the camera 100, and has, at both ends thereof, a positive contact 201a which is to be connected to the positive contact 101a, and a negative contact 101b, and further has battery cells 202 thereinside.

The determination contact 101c determines whether the battery pack 200 or the accessory 300 has been connected to the connection section 101. The resistors 105 and 106 divides a battery voltage between the positive contact 101a and the negative contact 101b, and the microcomputer 102 detects the divided voltage through the AD terminal having an analog-to-digital (A/D) converting function. The resistor 107 pulls up the BATSEL terminal of the microcomputer 102 which detects connection status conditions of the determination terminal 101c.

The microcomputer 102 controls the overall operation of the camera 100, detects the battery voltage as will be described later, and carries out a remaining battery level detecting process in FIG. 3 or 4, described later.

In detecting the battery voltage, the microcomputer 102 drives the BCON terminal high, and accordingly, the BC load circuit 103 operates to draw load current for the actuator driving section 104. When the microcomputer 102 drives the MON terminal high, the actuator driving section 104 causes the entire camera 100 to operate.

Figure 2:
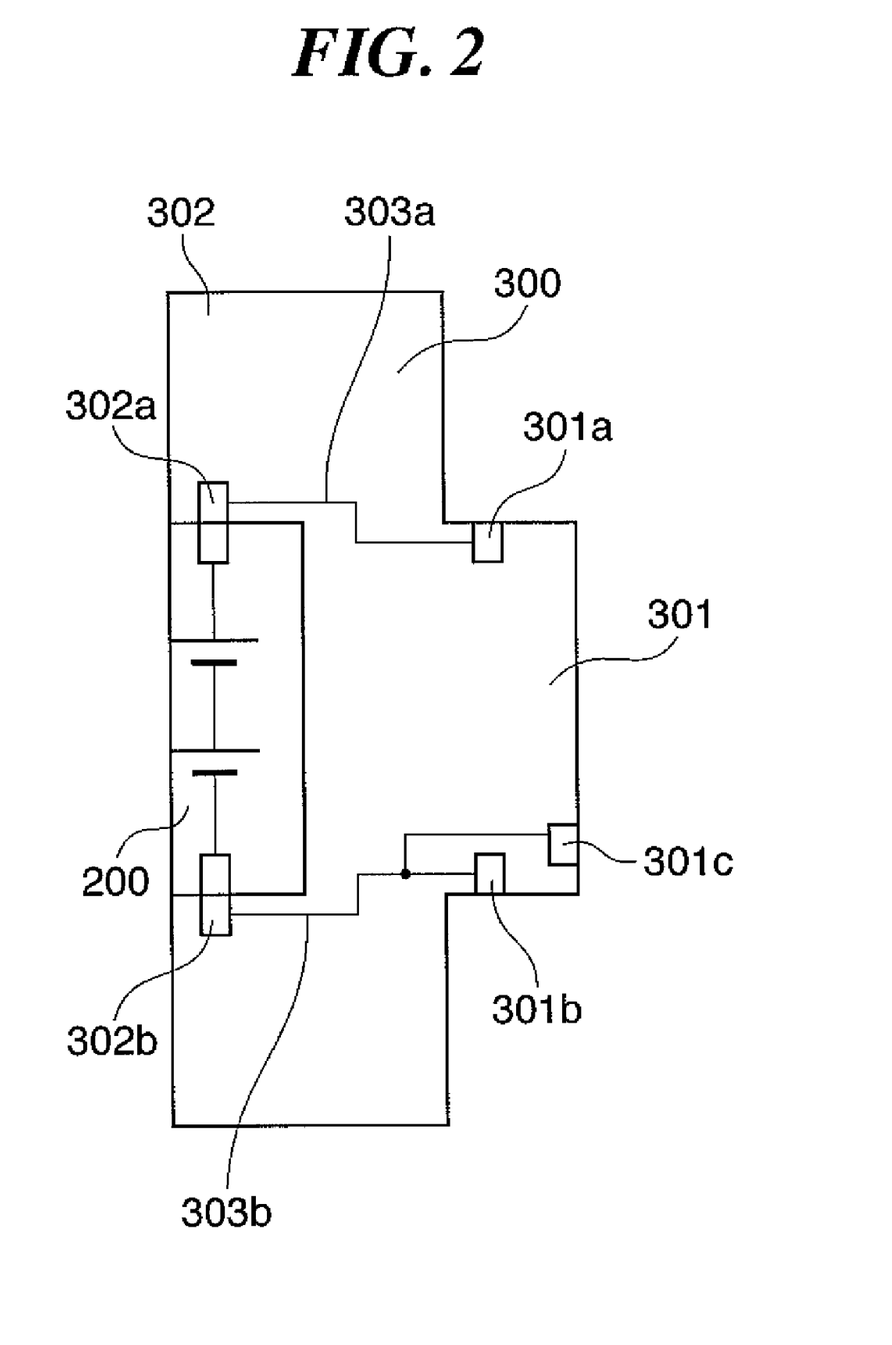
FIG. 2 is a block diagram schematically showing the construction of an accessory connected to a camera in FIG. 1.

FIG. 2 is a block diagram schematically showing the construction of an accessory connected to the camera 100 in FIG. 1.

As shown in FIG. 2, the accessory 300 is attached to the connection section 101 of the camera 100.

The accessory 300 has at one end thereof a connection section 301 which is concaved so as to fit in the connection section 101 of the camera 100, and at the other end thereof a connection 302 which is recessed so as to fit the battery pack 200 therein.

Also, the accessory 300 is comprised of a positive contact 301a disposed on one side of the connection section 301, a negative contact 301b disposed on the other side of the connection section 301, and a determination contact 301c disposed on the top of the connection section 301. The accessory 300 is further comprised of a positive contact 302a disposed on one side of the connection 302, and a negative contact 302b disposed on the other side of the connection 302.

The accessory 300 is further comprised of a path 303a which connects the positive contact 301a and the positive contact 302a to each other, and a path 303b which connects the negative contact 301b and the determination contact 301c and the negative contact 302b to one another.

Since the determination contact 301c is connected to the negative electrode contact 301b and the negative electrode contact 302b, the microcomputer 102 of the camera 100 detects that the BATSEL terminal is low when the accessory 300 is connected to the connection section 101, and detects that the BATSEL terminal is high when the battery pack 200 is connected to the connection section 101. Thus, the microcomputer 102 can determine which member has been connected to the connection section 101 based on the status of the BATSEL terminal.

Figure 3:
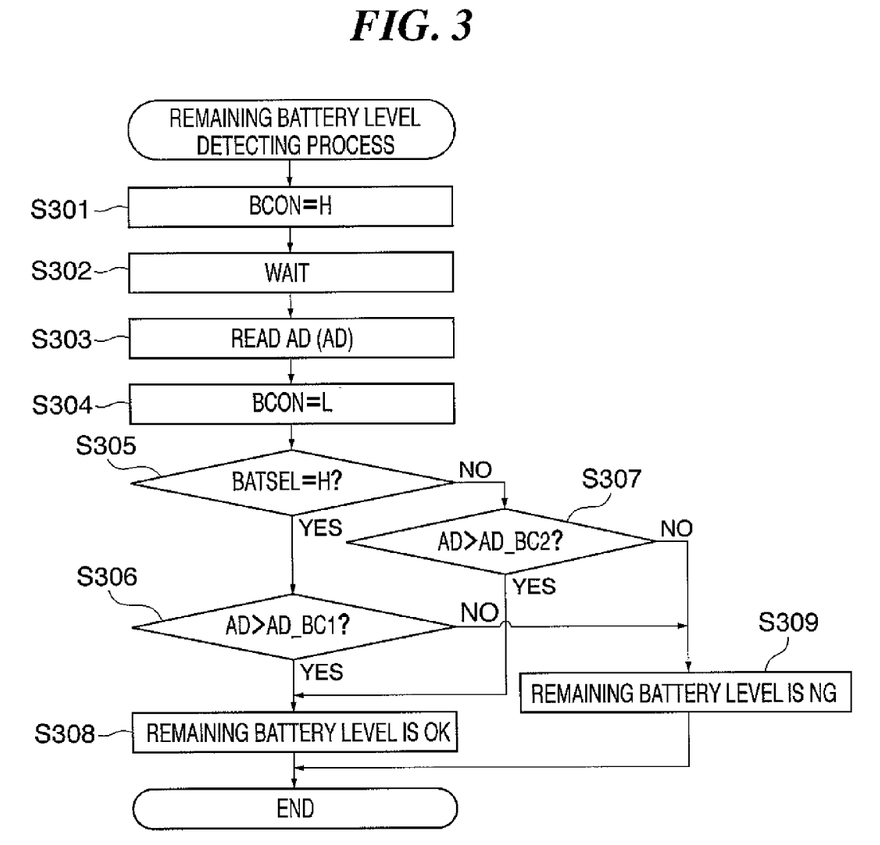
FIG. 3 is a flowchart showing the procedure of a remaining battery level detecting process carried out by a microcomputer appearing in FIG. 1.

FIG. 3 is a flowchart showing the procedure of a remaining battery level detecting process carried out by the microcomputer 102 appearing in FIG. 1.

As shown in FIG. 3, first, the BCON terminal is driven high, and a load current IBC for the actuator driving section 104 is drawn (step S301), and the lapse of the time required for battery voltage to become stable is awaited (step S302). After that, a battery voltage divided by the resistors 105 and 106 is read through the AD terminal and regarded as an AD value (step S303). The BCON terminal is then driven low, and the passage of the load current is terminated (step S304). It is then determined whether or not the BATSEL terminal is high (step S305).

If, as a result of the determination in the step S305, the BATSEL terminal is high, it is determined that the battery pack 200 has been attached to the connection section 101 of the camera 100, and the AD value obtained in the step S303 and a criterion of determination AD_BC1 (voltage threshold level), described later, for use in a case where the battery pack 200 has been attached to the connection section 101 of the camera 100 are compared with each other to determine whether or not the AD value is greater than the criterion of determination AD_BC1 (step S306).

If, as a result of the determination in the step S306, the AD value is greater than the criterion of determination AD_BC1, it is determined that the remaining battery level is OK (step S308), and on the other hand, if the AD value is smaller than the criterion of determination AD_BC1, it is determined that the remaining battery level is NG (step S309), followed by terminating the present process.

If, as a result of the determination in the step S305, the BATSEL terminal is not high, it is determined that the battery pack 200 has been attached to the connection section 101 of the camera 100 via the accessory 300, and the AD value obtained in the step S303 and a criterion of determination AD_BC2 (voltage threshold level), described later, for use in a case where the battery pack 200 has been attached to the connection section 101 of the camera 100 via the accessory 300 are compared with each other to determine whether or not the AD value is greater than the criterion of determination AD_BC2 (step S307).

If, as a result of the determination in the step S307, the AD value is greater than the criterion of determination AD_BC2, it is determined that the remaining battery level is OK (step S308), and on the other hand, if the AD value is smaller than the criterion of determination AD_BC2, it is determined that the remaining battery level is NG (step S309), followed by terminating the present process.

The relationship between the criterion of determination AD_BC1 and the criterion of determination AD_BC2 mentioned above is expressed by an equation (1) given below using the load current IBC and an increase in impedance RACC when the battery pack 200 is attached to the connection section 101 of the camera 100 via the accessory 300.

$$AD\_BC1 = AD\_BC2 + IBC \times RACC/VADREF \times ADBIT \quad (1)$$

where RACC is derived from the contact resistances of the contacts 302a and 302b of the accessory 300 for connection to the battery pack 200 and the resistances of the paths 303a and 303b, VADREF designates a reference voltage in A/D conversion carried out by the microcomputer 102, and ADBIT designates the number of bits in A/D conversion carried out by the microcomputer 102 and is, for example, 256 when the AD value is an 8-bit value.

Accordingly, the criterion of determination AD_BC1 can be made higher than the criterion of determination AD_BC2 by the increase in impedance RACC when the battery pack 200 is attached to the connection section 101 of the camera 100 via the accessory 300 and a voltage drop in the load current TBC, and therefore, the end voltage of the battery pack 200 itself exhibited when it is determined that the remaining battery level is NG can be uniform.

Specifically, the remaining battery level of the battery pack 200 which has been attached to the connection section 101 of the camera 100 via the accessory 300 and of which remaining battery level has been determined as being NG can be determined as being NG even when the accessory 300 is detached from the connection section 101 of the camera 100 and the battery pack 200 is directly attached to the connection section 101 of the camera 100. It should be noted that the criterion of determination AD_BC1 and the criterion of determination AD_BC2 are set based on the minimum voltage with which it is possible to drive the camera 100 or the discharge stop voltage of the battery pack 200 and within such a range as not to interfere with the operation of the camera 100.

According to the remaining battery level detecting process in FIG. 3, when the BATSEL terminal is detected high (YES to the step S305) and the AD value is smaller than the criterion of determination AD_BC1 (NO to the step S306), or when the BATSEL terminal is detected low (NO to the step S305) and the AD value is smaller than the criterion of determination AD_BC2 (NO to the step S307), it is determined that the remaining battery level is NG (step S309). Accordingly, irrespective of whether the battery is used as the internal battery or the external battery, it is possible to perform battery check with accuracy and make the end voltages of the internal battery and the external battery coincide with each other.

Figure 4:
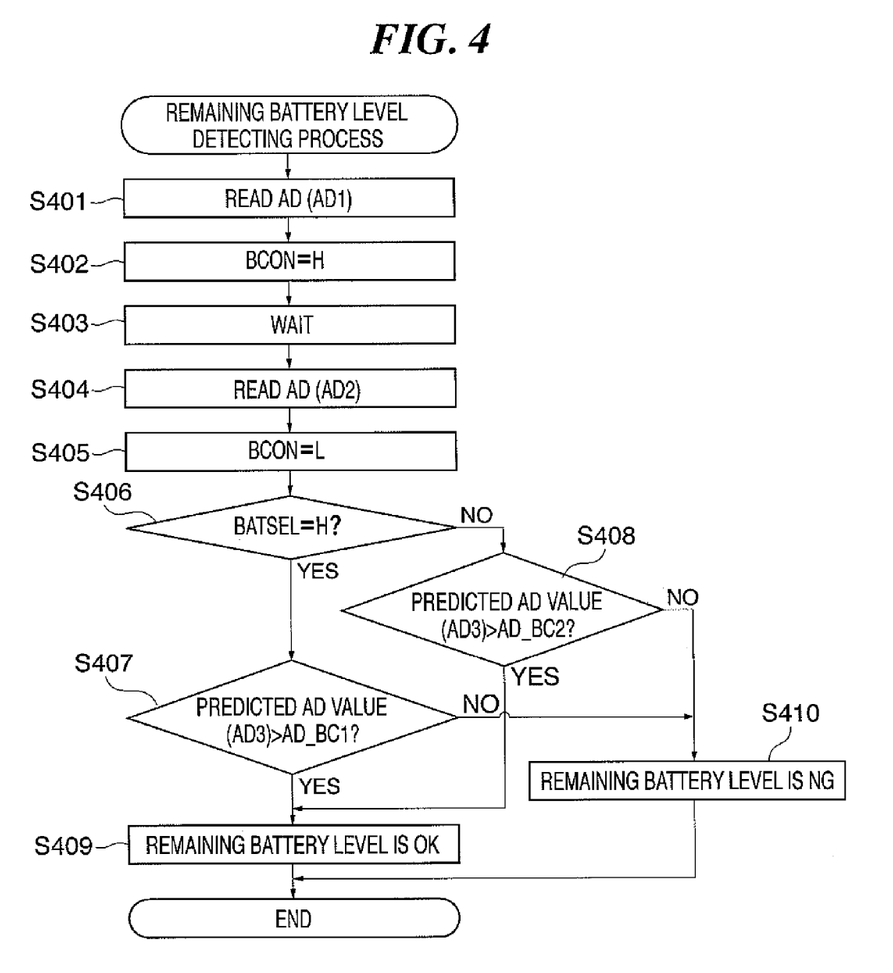
FIG. 4 is a flowchart showing the procedure of a variation of the remaining battery level detecting process carried out by the microcomputer appearing in FIG. 1.

FIG. 4 is a flowchart showing the procedure of a variation of the remaining battery level detecting process carried out by the microcomputer 102 appearing in FIG. 1.

As shown in FIG. 4, first, a battery voltage divided by the resistor 105 and the resistor 106 is read through the AD terminal and regarded as an AD1 value, a battery voltage before voltage dividing is regarded as a value VAD1, and a consumption current determined by the operating state of the camera 100 is regarded as I1 (step S401). Next, the BCON terminal is driven high, and a current IBC2 lower than the load for the actuator driving section 104 is drawn (step S402), and the lapse of the time required for battery voltage to become stable is awaited (step 5403). After that, a battery voltage divided by the resistor 105 and the resistor 106 is read through the AD terminal and regarded as an AD2 value, and a battery voltage before voltage dividing is regarded as a value VAD2 (step S404). Further, the BCON terminal is driven low, and the passage of load current is terminated (step S405). It is then determined whether or not the BATSEL terminal is high (step S406).

If, as a result of the determination in the step S406, the BATSEL terminal is high, it is determined that the battery pack 200 has been attached to the connection section 101 of the camera 100, and an internal resistance from the battery pack 200 to the AD terminal is computed using a method described later from the value AD1 obtained in the step S401 and the AD2 value obtained in the step S404, a predicted AD value (AD3 value) of a readout AD value and a predicted battery voltage VAD3 in a case where the actuator driving section 104 or the like is actuated at the maximum load (IMAX) are computed using a method described later, and the AD3 value and the criterion of determination AD_BC1 (voltage threshold level) are compared with each other to determine whether or not the AD3 value is greater than the criterion of determination AD_BC1 (step S407).

If, as a result of the determination in the step S407, the AD3 value is greater than the criterion of determination AD_BC1, it is determined that the remaining battery level is OK (step S409), and on the other hand, if the AD3 value is smaller than the criterion of determination AD_BC1, it is determined that the remaining battery level is NG (step S410), followed by terminating the present process.

If, as a result of the determination in the step S406, the BATSEL terminal is not high, it is determined that the battery pack 200 has been attached to the connection section 101 of the camera 100 via the accessory 300, and an internal resistance from the battery pack 200 to the AD terminal is computed using a method described later from the AD1 value obtained in the step S401 and the AD2 value obtained in the step S404, a predicted AD value (AD3 value) of a readout AD value and a predicted battery voltage VAD3 in a case where the actuator driving section 104 or the like is actuated at the maximum load (IMAX) are computed using a method described later, and the AD3 value and the criterion of determination AD_BC2 are compared with each other to determine whether or not the AD3 value is greater than the criterion of determination AD_BC2 (step S408).

If, as a result of the determination in the step S408, the AD3 value is greater than the criterion of determination AD_BC2, it is determined that the remaining battery level is OK (step S409), and on the other hand, if the AD3 value is smaller than the criterion of determination AD_BC2, it is determined that the remaining battery level is NG (step S410), followed by terminating the present process.

The above-mentioned internal resistance is expressed by the following equation (2):

$$\text{Internal resistance} = (VAD1 - VAD2)/IBC2 \quad (2)$$

where VAD1 is expressed by the following equation (3), and VAD2 is expressed by the following equation (4):

$$VAD1 = AD1 \times VADREF/ADBIT \quad (3)$$

$$VAD2 = AD2 \times VADREF/ADBIT \quad (4)$$

where VADREF designates a reference voltage in A/D conversion carried out by the microcomputer 102, and ADBIT designates the number of bits in A/D conversion carried out by the microcomputer 102, and is, for example, 256 when the AD value is an 8-bit value.

Further, VAD3 is expressed by the following equation (5):

$$VAD3 = VAD2 - \text{internal resistance} \times (IMAX - IBC2 - I1) \quad (5)$$

Also, VAD3 is expressed by the following equation (6):

$$VAD3 = AD3 \times VADREF/ADBIT \quad (6)$$

Accordingly, the predicted AD value (AD3 value) mentioned above is expressed by the following equation (7) based on the above equations (2) to (6):

$$AD3 = AD2 - (AD1 - AD2)/IBC2 \times (IMAX - IBC2 - I1) \quad (7)$$

According to the variation of the remaining battery level detecting process in FIG. 4, the BCON terminal is driven high and the current IBC2 lower than the load for the actuator driving section 104 is drawn (step S402), and when the BAT-SEL terminal is detected high (YES to the step S406) and the AD3 value is smaller than the criterion of determination AD_BC1 (NO to the step S407), or when the BATSEL terminal is detected low (NO to the step S406) and the AD3 value is smaller than the criterion of determination AD_BC2 (NO to the step S408), it is determined that the remaining battery level is NG (step S410). Accordingly, it is possible to detect the remaining battery level of the battery by predicting the battery voltage at the maximum load (IMAX) without drawing a current corresponding to the maximum load. Also, irrespective of whether the battery is used as the internal battery or the external battery, it is possible to perform battery check with accuracy and make the end voltages of the internal battery and the external battery coincide with each other.

The relationship between the criterion of determination AD_BC1 and the criterion of determination AD_BC2 mentioned above is expressed by:

$$AD\_BC1 = AD\_BC2 + IMAX \times RACC/VADREF \times ADBIT$$

where RACC is derived from the contact resistances of the contacts 302a and 302b of the accessory 300 for connection to the battery pack 200 and the resistances of the paths 303a and 303b, VADREF designates a reference voltage in A/D conversion carried out by the microcomputer 102, and ADBIT designates the number of bits in A/D conversion carried out by the microcomputer 102, and is, for example, 256 when the AD value is an 8-bit value.

The above equation differs from the equation (1) of the above described embodiment in that IMAX is used instead of IBC.

Although in the above described embodiment, the present invention is applied to the detection of the final remaining battery level, the present invention may be applied to the detection of the intermediate remaining battery level.

It is to be understood that the object of the present invention may also be accomplished by supplying a system or an apparatus with a storage medium in which a program code of software, which realizes the functions of the above described embodiment is stored, and causing a computer (or CPU or MPU) of the system or apparatus to read out and execute the program code stored in the storage medium.

In this case, the program code itself read from the storage medium realizes the functions of the above described embodiment, and hence the program code and the storage medium in which the program code is stored constitute the present invention.

Examples of the storage medium for supplying the program code include a floppy (registered trademark) disk, a hard disk, a magnetic-optical disk, a CD-ROM, a CD-R, a CD-RW, a DVD-ROM, a DVD-RAM, a DVD-RW, a DVD+RW, a magnetic tape, a nonvolatile memory card, and a ROM. Alternatively, the program code may be downloaded via a network.

Further, it is to be understood that the functions of the above described embodiment may be accomplished not only by executing a program code read out by a computer, but also by causing an OS (operating system) or the like which operates on the computer to perform a part or all of the actual operations based on instructions of the program code.

Further, it is to be understood that the functions of the above described embodiment may be accomplished by writing a program code read out from the storage medium into a memory provided on an expansion board inserted into a computer or in an expansion unit connected to the computer and then causing a CPU or the like provided in the expansion board or the expansion unit to perform a part or all of the actual operations based on instructions of the program code.

The above-described embodiments are merely exemplary of the present invention, and are not be construed to limit the scope of the present invention.

The scope of the present invention is defined by the scope of the appended claims, and is not limited to only the specific descriptions in this specification. Furthermore, all modifications and changes belonging to equivalents of the claims are considered to fall within the scope of the present invention.

This application claims the benefit of Japanese Patent Application No. 2005-244912 filed Aug. 25, 2005, which is hereby incorporated by reference herein in its entirety.

What is claimed is:

1. A battery-powered apparatus comprising:
   a recessed connection section to which either of a battery pack or an accessory having another recessed connection section for receiving another battery pack therein is attachable;
   a determining unit adapted to determine whether the battery pack is directly attached to the recessed connection section or the accessory having the another recessed connection section receiving the another battery pack therein is attached to the recessed connection section;
   a setting unit adapted to set a predetermined voltage threshold level based on a result of the determining unit;
   a detecting unit adapted to detect a voltage value output from the battery pack directly attached to the recessed connection section or the accessory having the another battery therein; and
   a deciding unit adapted to decide whether or not the battery-powered apparatus is drivable, based on the voltage value detected by the detecting unit,
   wherein the setting unit sets the predetermined voltage threshold level to a first threshold level when the determining unit determines that the battery pack is directly attached to the recessed connection section, and sets the predetermined voltage threshold level to a second threshold level when the determining unit determines that the accessory having the another recessed connection section receiving the another battery pack therein is attached to the recessed connection section, the second threshold level being lower than the first threshold level, and being set based on an impedance from the another recessed connection section of the accessory to the recessed connection section.

2. A battery-powered apparatus according to claim 1, wherein the first threshold level is set based on a minimum voltage at which the battery pack is possible to drive the apparatus or a discharge stop voltage of the battery pack.

3. A battery-powered apparatus comprising:
   a recessed connection section to which either of a battery pack or an accessory having another recessed connection section for receiving another battery pack therein is attachable;
   a determining unit adapted to determine whether the battery pack is directly attached to the recessed connection section or the accessory having the another recessed connection section receiving the another battery pack therein is attached to the recessed connection section;
   a setting unit adapted to set a predetermined voltage threshold level based on a result of the determining unit;
   a detecting unit adapted to detect a voltage value output from the battery pack directly attached to the recessed connection section or the accessory having the another recessed connection section receiving the another battery pack therein;
   a deciding unit adapted to decide whether or not the battery-powered apparatus is drivable, based on the predetermined voltage threshold level set by the setting unit and the voltage value detected by the detecting unit; and
   a controller adapted to control the setting unit to set the predetermined voltage threshold level to a first threshold level when the determining unit determines that the battery pack is directly attached to the recessed connection section, and to set the predetermined voltage threshold level to a second threshold level when the determining unit determines that the accessory having the another recessed connection section receiving the another battery pack therein is attached to the recessed connection section, the second threshold level being lower than the first threshold level, and being set based on an impedance of an electrical circuit from the another recessed connection section of the accessory to the recessed connection section.

4. A battery-powered apparatus according to claim 3, wherein the first threshold level is set based on a minimum voltage at which the battery pack is possible to drive the apparatus or a discharge stop voltage of the battery pack.

5. A battery-powered apparatus according to claim 1, wherein the setting unit sets the predetermined voltage threshold level to a second threshold level lower than the first threshold level based on an impedance of an electric circuit from the another recessed connection section of the accessory to the recessed connection section and a load current of the apparatus, when the determining unit determines that the accessory having the another recessed connection section receiving the another battery pack therein is attached to the recessed connection section.

6. A battery-powered apparatus according to claim 5, wherein the controller sets the predetermined voltage threshold level to a second threshold level lower than the first threshold level based on an impedance of an electric circuit from the another recessed connection section of the accessory to the recessed connection section and a load current of the apparatus, when the determining unit determines that the accessory having the another recessed connection section receiving the another battery pack therein is attached to the recessed connection section.

* * * * *